(12) United States Patent
Stan et al.

(10) Patent No.: US 8,000,161 B2
(45) Date of Patent: Aug. 16, 2011

(54) METHOD AND SYSTEM FOR ENCODING TO ELIMINATE PARASITICS IN CROSSBAR ARRAY MEMORIES

(75) Inventors: Mircea R. Stan, Charlottesville, VA (US); Adam C. Cabe, Montpelier, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 666 days.

(21) Appl. No.: 12/165,281

(22) Filed: Jun. 30, 2008

(65) Prior Publication Data
US 2009/0003040 A1    Jan. 1, 2009

Related U.S. Application Data

(60) Provisional application No. 60/937,598, filed on Jun. 28, 2007.

(51) Int. Cl.
*G11C 7/00* (2006.01)
(52) U.S. Cl. ............ 365/202; 341/50; 341/59; 365/151; 365/190
(58) Field of Classification Search .................... 341/50, 341/55, 58, 59, 164, 165; 365/148, 151, 365/190, 202
See application file for complete search history.

(56) References Cited

U.S. PATENT DOCUMENTS

| | | | | |
|---|---|---|---|---|
| 3,805,254 | A * | 4/1974 | Schuur ..................... | 365/189.16 |
| 4,309,694 | A * | 1/1982 | Henry ............................. | 341/58 |
| 6,256,767 | B1 | 7/2001 | Kuekes et al. | |
| 6,633,951 | B2 * | 10/2003 | Cohen ........................... | 711/105 |
| 6,661,355 | B2 | 12/2003 | Cornelius et al. | |
| 7,764,792 | B1 * | 7/2010 | Avivi et al. ..................... | 380/255 |
| 2003/0086302 | A1 * | 5/2003 | Kurakata et al. ......... | 365/189.02 |

OTHER PUBLICATIONS

Frankfort et al., "Semi-empirical Study of pH-switchable [2] rotaxane," 2003, Journal of Molecular Structure (Theochem). vol. 621, pp. 253-260.*
Gergel et al., "Study of the room temperature molecular memory observed from a nanowell device," 2005, Journal of Vacuum Science and Technology A, vol. 23, Issue 4, pp. 880-885.*
Green et al., "A 160-kilobit molecular electronic memory patterned at 10 bits per square centimetre," 2007, Nature, vol. 445, pp. 414-417.*
Rose et al., "Designing CMOS/Molecular Memories While Considering Device Parameter Variations," Apr. 2007, ACM Journal on Emerging Technologies in Computing Systems, vol. 3, No. 1, art. 3, pp. 1-24.*
Knuth, "Efficient Balanced Codes," 1986, IEEE Transactions on Information Theory, vol. IT-32, No. 1, pp. 51-53.*
Tallini et al., "Balanced Codes with Parallel Encoding and Decoding," 1999, IEEE Transactions on Computers, vol. 48, No. 8, pp. 794-814.*
Nackashi et al., "Molecular Electronic Latches and Memories," 2005, Proceedings of 2005 5th IEEE Conference on Nanotechnology, 4 pages.*

(Continued)

*Primary Examiner* — Dang T Nguyen
*Assistant Examiner* — Alexander Sofocleous
(74) *Attorney, Agent, or Firm* — Novak Druce DeLuca + Quigg LLP; Robert J. Decker

(57) ABSTRACT

A method of encoding data stored in a crossbar memory array, such as a nanowire crossbar memory array, to enable significant increases in memory size, modifies data words to have equal numbers of '1' bits and '0' bits, and stores the modified words together with information enabling the original data to be retrieved upon being read out from memory.

19 Claims, 4 Drawing Sheets

OTHER PUBLICATIONS

Rose et al., "Large-Signal Two-Terminal Device Model for Nanoelectronic Circuit Analysis," 2004, IEEE Transactions on Very Large Scale Integration (VLSI) Systems, vol. 12, No. 11, pp. 1201-1208.*

Cabe et al., "Reducing Stray Currents in Molecular Memory Through Data Encoding," Aug. 2007, Proceedings of the 7th IEEE International Conference on Nanotechnology, pp. 70-75.*

* cited by examiner

METHOD AND SYSTEM FOR ENCODING TO ELIMINATE PARASITICS IN CROSSBAR ARRAY MEMORIES

CROSS-REFERENCE TO RELATED APPLICATIONS

This application claims benefit under 35 U.S.C. §119(e) to U.S. Provisional Patent Application Ser. No. 60/937,598 filed on Jun. 28, 2007, which is hereby incorporated by reference in its entirety.

STATEMENT REGARDING FEDERALLY SPONSORED RESEARCH OR DEVELOPMENT

This invention was not made in the course of federally sponsored research or development.

BACKGROUND OF THE INVENTION

Silicon-based integrated circuits have long been the mainstay of the electronics industry, driving products to become smaller and faster based on the predictions made by Moore's Law. Recently however, these scaling trends have slowed due to difficulties in fabricating nanometer scale devices. It is predicted that soon, lithographic based fabrication will reach a barrier when attempting to pattern devices containing only a few atoms per transistor. Research efforts are in place to find a solution to these lithographic limitations within the standard CMOS process.

Many novel technologies have been proposed as alternatives to the traditional CMOS process. A few of such devices are carbon nanotubes, quantum cellular automata (QCA), single electron transistors, and molecular devices. Carbon nanotubes are popular devices among researchers due to their potential for extremely fast operating speeds. The problem with carbon nanotubes lies in the difficulty to accurately place large quantities of nanotubes in a patterned layout. QCA presents a simple concept to creating nano-electronic logic; however, QCA suffers from the lack of any fault tolerance within the architecture itself. Single electron transistors also are popular due to their potential for extremely high switching speeds; however single electron transistors suffer from the inability to operate anywhere near room temperature. Single electron transistors generally require temperatures below 20° Kelvin for stability. Molecular devices allow for fast switching speeds, while being able to operate at room temperature. Since the standard architecture for these devices is the regular crossbar array, it is easy to pattern and layout large quantities of these devices useful for both memory and logic.

Additional benefits of molecular devices pertain specifically to non-volatile memory design. Certain molecules, such as Rotaxane and nitro-based OPE (Oligophenylene ethynylenes), have two different conductivity states when placed into a crossbar array based design. One state is a high conductivity state, and the other is a low conductivity state. These two states represent the equivalents of logic '1' and logic '0' as found in memories such as SRAM and DRAM. Using these devices in the crossbar array yields a molecular-based, non-volatile memory architecture. This particular memory architecture is of interest mainly due to the device density. The ITRS (International Technology Roadmap for Semiconductors) states that molecular memories have the smallest demonstrated and projected cell area of 30 nm and 5 nm respectively, and the smallest projected feature size of $5F^2$.

One large drawback of this molecular memory architecture is that as the memory size grows larger, introducing more devices into the crossbar array, the more difficult it becomes to distinguish a logic '1' from a logic '0'. This is due to the parasitic current paths existing within the crossbar array itself. In fact, this is an intrinsic problem with the crossbar array and exists in any memory array based on this crossbar architecture. One potential solution to this problem is to make the devices themselves act more like true diodes. In this sense, current could not flow through the parasitic paths of the crossbar array because certain devices would be reverse-biased, allowing only minutely small amounts of current to leak through the array. However, in practice this would be difficult to achieve, merely due to the scale of the devices within the architecture. Most of these molecules are only a few angstroms long, which will elicit band-to-band tunneling across the device even if the molecule is indeed more diode-like.

Thus, there exists a need to eliminate the effects of these parasitic current paths, allowing for larger, readable crossbar-array based memory arrays to be obtained.

SUMMARY OF THE INVENTION

According to one preferred embodiment, a memory device is formed by a two-dimensional crossbar array of molecular devices. This crossbar array structure includes one layer of parallel nanowires crossed perpendicularly by another layer of parallel nanowires. At each junction of this array of nanowires exists a bi-stable molecular device, creating an array of two terminal bi-stable devices.

The invention encompasses both an architectural adjustment to the crossbar array memory, and an encoding solution to eliminate the impacts of parasitic currents on the memory. The general method to access one bit from the memory is to apply a voltage on one vertical wire (column) and observe the output voltage or current on one particular horizontal wire (row). The device intersecting these two wires is the device under test (DUT).

In the preferred embodiment, all the rows and columns not being accesses are grounded. This is done through a series of multiplexers connected to each nanowire. This grounding eliminates all of the off-selected-row parasitic current paths. Consequently, only the parasitics from the on-row devices can affect the DUT.

In the preferred embodiment, each word is encoded so that the impacts of the parasitics are eliminated. By encoding each word to hold half logic '1' values and half logic '0' values, each bit becomes uniquely readable, and the voltage '1'/'0' ratio ceases to decrease with increasing array size. This allows for arbitrarily large crossbar memory arrays, without any of the parasitic current problems. In addition, the encoding scheme is intrinsically parity checked, which allows for easy checking of bit errors.

Balanced encoding algorithms aim to equate the number of '0's and '1's for a given binary stream. For illustrative purposes, the following example algorithm is provided:

(1) Count the number of 1's in the word.

'10110111'–Has six '1's=[110]     (count1)

(2) Serially flip each bit until the word contains half '1's and half '0's. Count the number of bits flipped.

Resulting word–'01000111'=[100]     (count2)

(3) Attach count2, followed by its inverse $\overline{count2}$, to the new word.

Final word–'01000111[100][011]'

This encoding/architectural solution will work with any crossbar array-based memory, not only with molecular memories. Other bi-stable, resistive, crossbar array memories, such as MRAM, are also based upon this architecture, and this scheme will provide the same results to these other memories.

As discussed above, although the potential for molecular memory technology is high, and promising results have been shown, there exists in the art a major issue concerning memory scaling with this architecture, in particular with molecular memory. As the memory size increases, it becomes very difficult to distinguish the value of each stored bit. The invention presented here eliminates this problem, allowing the designer to create arbitrarily large memories without the risk of bit errors due to memory scaling issues. This can drastically lower the incidence of bit errors and is cohesive with any crossbar array-based molecular memory.

For example, one benefit of the invention is the use of encoding to eliminate the impact of stray parasitic currents in memory. A second benefit is the use of balanced encoding to encode words in crossbar array-based memories. This provides an adequate coding method to eliminate the impact of parasitic currents within these crossbar memories.

Some non-limiting and exemplary products and services that various embodiments may utilize include the following:
  Ultra dense processors, which require very dense memory arrays to support them;
  Field-Programmable Gate Array (FPGA) designs, which utilize very dense off-chip memories for storing and reconfigurability;
  Any design requiring on-chip memory. These memory structures could serve as replacements for bulky SRAM and embedded DRAM architectures.

DETAILED DESCRIPTION OF THE INVENTION

Molecular Crossbar Array

Figure 1:
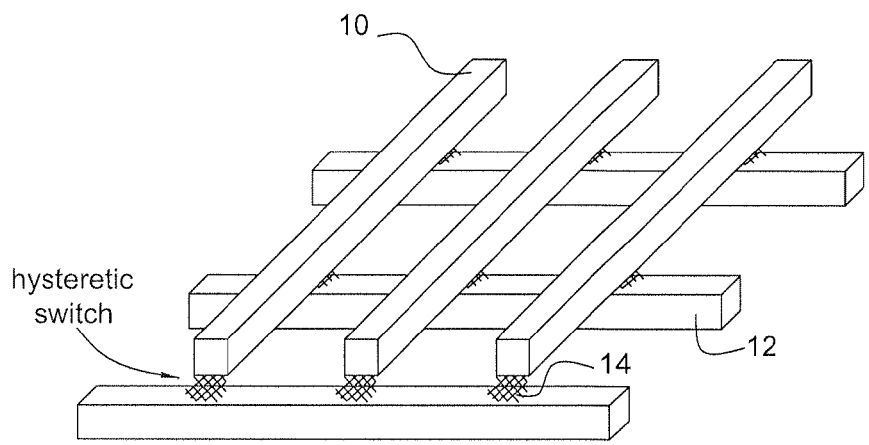
FIG. 1 is a three dimensional view of an example crossbar memory array, showing two layers of parallel nanowires crossing perpendicularly. At each junction exists a bi-stable resistive device, creating an array of two terminal devices.
Figure 2:
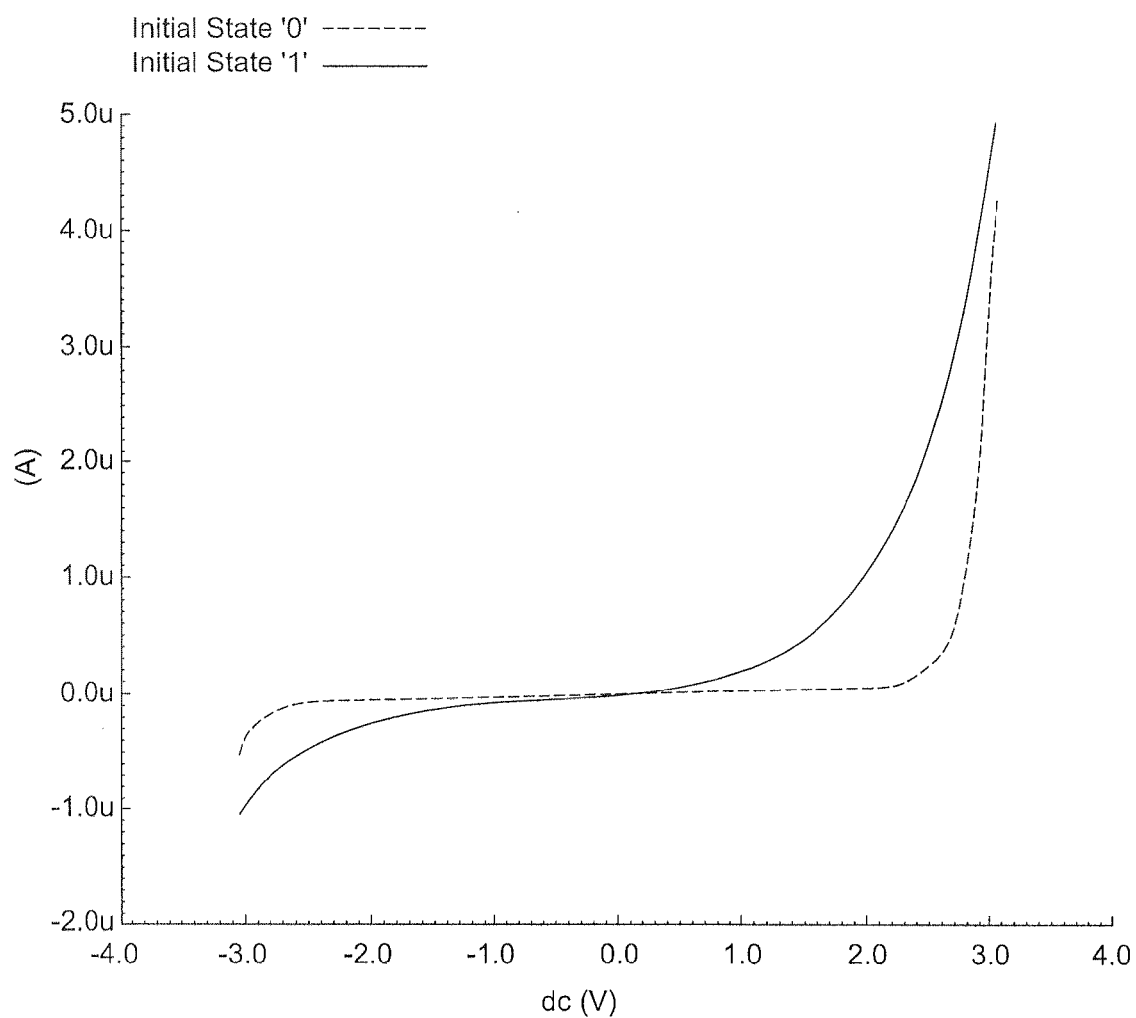
FIG. 2 illustrates the typical hysteretic IV characteristic of these bi-stable resistive devices.

FIG. 1 illustrates a crossbar array in accordance with an embodiment of the invention. The crossbar structure consists of a first layer of parallel nanowires 10 crossed perpendicularly by another layer of parallel nanowires 12. At each junction in this array of nanowires exists a bi-stable resistive device 14, creating an array of two terminal bi-stable devices. A typical current-voltage (IV) curve for this type of bi-stable device is shown in FIG. 2. There are two different conductivity states shown in this IV curve, each state representing either a logic '1' or logic '0'. The devices of interest for this invention are reconfigurable, meaning they can be switched from one state to another by applying either a large positive or negative voltage across the two terminals. With this, there now exists an array of two terminal, programmable devices, each device capable of storing either a logic '1' or logic '0', which is essential for memory.

Figure 3A:
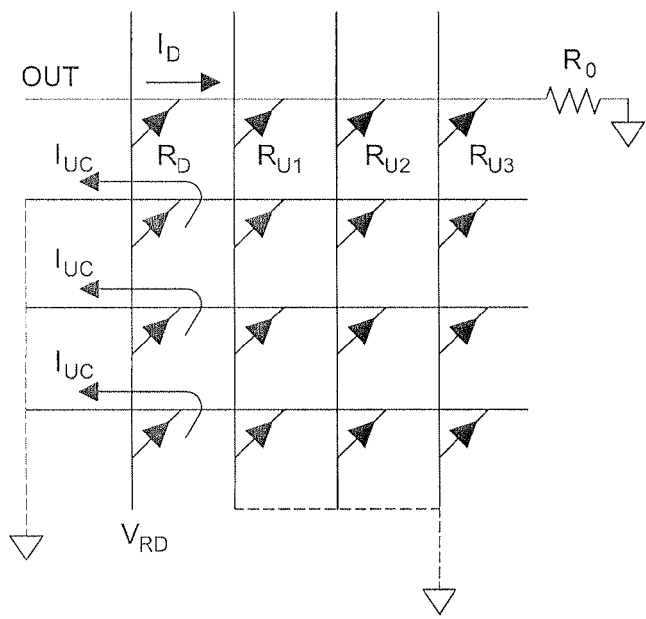
FIG. 3A is a schematic representation of an example version of a crossbar array, where each crossing nanowire is connected by a bi-stable device. In this view, the device in the upper left corner is being read. A voltage is applied on the leftmost column, and a voltage is read out on the uppermost row. Also, the unselected rows and columns are grounded.

FIG. 3A shows a schematic representation of the crossbar memory. In this figure, the device $R_D$ in the upper left hand corner is being accessed and read by applying a voltage, $V_{RD}$, on the leftmost nanowire column and reading out the voltage on the uppermost nanowire row. In the typical architecture, the dashed wires shown in FIG. 3A are left out, leaving the unselected rows and columns "floating" while trying to read one bit. However, since these devices are not ideal diodes, they have both a forward-biased and a reverse-biased current, which means current will flow through not only the selected device $R_D$, but also through all of the unselected devices, even if these devices are off. The currents flowing through the unselected devices are termed "parasitic currents," as they are undesirable in the memory.

Figure 5:
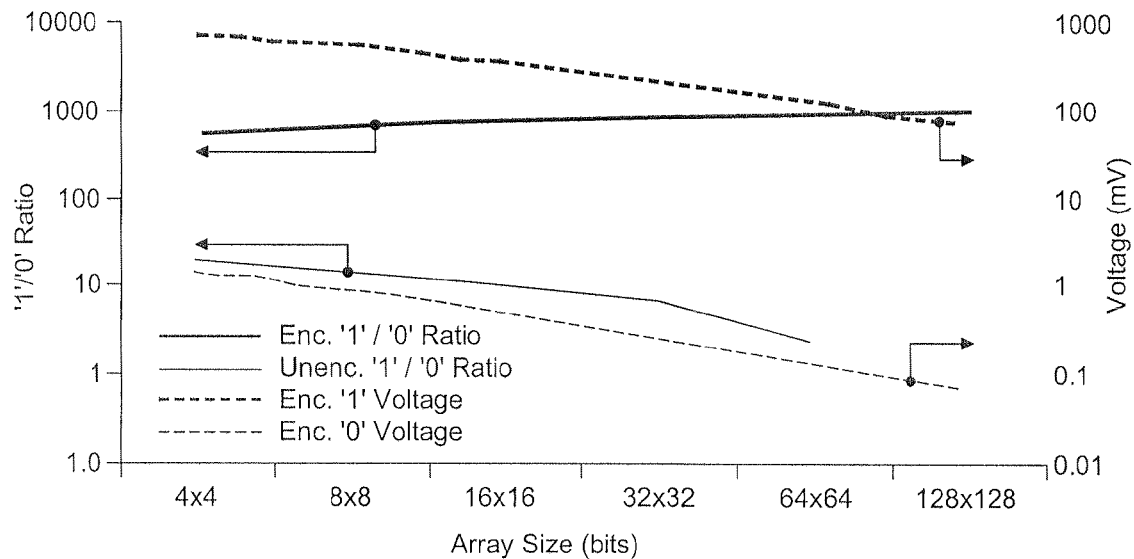
FIG. 5 is a graph showing simulated results from an encoded memory. The '1'/'0' ratio comparison is shown on the left axis, and the actual encoding voltages are shown on the right axis. It is shown that as the memory gets larger, the encoded '1'/'0' ratio slightly increases up towards 1000, while the unencoded array decreases below 1.

Ideally, the output read at the terminal OUT in FIG. 3A should be only dependent upon the DUT $R_D$; however these parasitic currents flow through the array and obscure the output voltage read at output terminal OUT. As the array grows larger, more and more of these unselected devices pass parasitic currents to the output, eventually making it impossible to clearly decide whether the DUT is a logic '1' or a logic '0'. This impact is shown in FIG. 5. The line marked with diamonds represents the voltage '1'/'0' ratio of a bit in an unencoded memory. As is shown, the ratio drops below 1 after the array grows slightly past 4 kilobits in size. At this point, it would be impossible to determine the state of the bit in the array, rendering the memory useless.

In accordance with the invention, the unselected rows and columns are grounded while reading a particular bit, in this case $R_D$. This shunts to ground any off-selected-row parasitic currents, shown as $I_{uc}$ in FIG. 3A, making the output OUT dependent only on the selected device $R_D$ and whatever parasitic currents exist from the unselected devices on the same row as $R_D$. This equivalent circuit is shown in FIG. 3B.

Balanced Coded Array

Figure 3B:
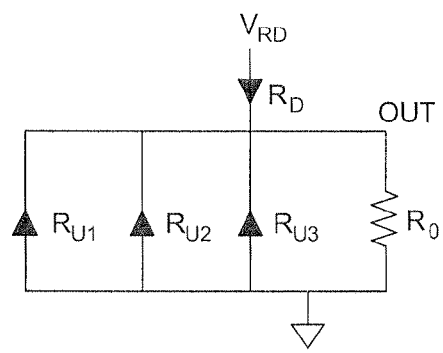
FIG. 3B is an example schematic representation for reading a device Rd, with all of the unselected rows and columns grounded.

As shown in FIG. 3B, the voltage read at the node OUT will be dependent upon the current drawn through the device $R_D$ and the unselected devices on this same row. Given an arbitrary word stored in these devices, it is impossible to know the exact current drawn through these unselected devices, since the states of these devices are unknown.

In a preferred embodiment, each word is encoded and stored into this memory so that the lumped resistance of these unselected devices becomes known; therefore, the exact current drawn through them becomes known. Once the current draw through these unselected devices becomes known, it is easy to determine the exact current draw for reading a logic '1' and for a logic '0' from the device $R_D$ as shown in FIG. 3A.

Figure 4A:
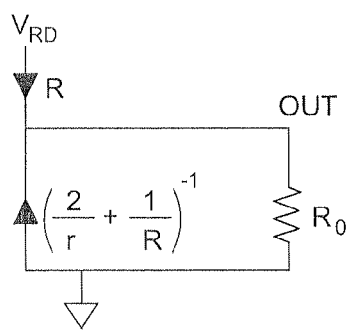
FIG. 4A is an example schematic representation of a balanced encoded memory when the device under test is a logic '1'.
Figure 4B:
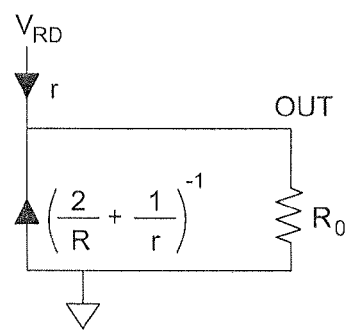
FIG. 4B is an example schematic representation of a balanced encoded memory when the device under test is a logic '0'.

Encoding each word to have half ones and half zeros places half of the devices in each word into a high conductivity state, and the other half into a low conductivity state. Now the lumped equivalent parallel resistance of the unselected devices can be easily determined, given the device resistance values in each state. For example, given a four bit balanced coded word, assume the DUT ($R_D$ in this case) is a logic '1', which is represented by 'R' (logic '0' is represented by 'r'). This situation is described in FIG. 4A. Since the DUT is a logic '1', and the word is balanced coded, two of the unselected devices must be logic '0' and one unselected device must be a logic '1'. This yields half '1's and half '0's, the primary property of the balanced encoding scheme. The order of the '1's and '0's does not matter, since now this resistance can be lumped together by the formula shown in FIG. 4A: $[2/r+1/R)]^{-1}$. This situation also holds true when reading a logic '0' represented by 'r', as is shown in FIG. 4B. Now there must exist two logic '1's and one logic '0' in the unselected devices for the encoding scheme to hold, and the equivalent resistance of these unselected devices is shown in FIG. 4B: $[2/R+1/r)]^{-1}$. This will hold true over all array sizes where the formulas for the lumped unselected device resistance is as follows, where N is the number of devices in a row:

(1) The value of the lumped resistance when the DUT is a logic '0'

$$\left[\frac{\left(\frac{N}{2}\right)}{R} + \frac{\left(\frac{N}{2}\right)-1}{r}\right]^{-1}$$

(2) The value of the lumped resistance when the DUT is a logic '1'

$$\left[\frac{\left(\frac{N}{2}\right)}{r} + \frac{\left(\frac{N}{2}\right)-1}{R}\right]^{-1}$$

FIG. 5 shows the '1'/'0' current ratios for the encoded and unencoded memories, and the exact voltage values for the encoded memory over various array sizes. Notice that the unencoded '1'/'0' ratio decreases as the array size increases. This again is because the parasitic current paths are affecting the output, making a logic '1' seem more and more like a logic '0'. However, the '1'/'0' ratio for the encoded memory actually increases as the array size grows. This increase is somewhat counterintuitive, however the increase is very small (factor of 2 while increasing area from 4×4 to 128×128). This is probably due to the nonlinearities in the devices themselves, which can be easily observed through the IV curve shown in FIG. 2.

There are two more important things to notice. One is that for each array size, there exists only one logic '1' voltage, and one logic '0' voltage. This is because the encoding makes the output deterministic, whereas before the voltage output depended on the state of each device in the array, yielding a worst and best case value. The second thing to notice is simply that the encoded '1'/'0' ratios are 100 to 1000 times higher than the unencoded ratios, making it much easier to determine the logic state of the device.

Hardware Implementation of Balanced Encoding

Figure 6:
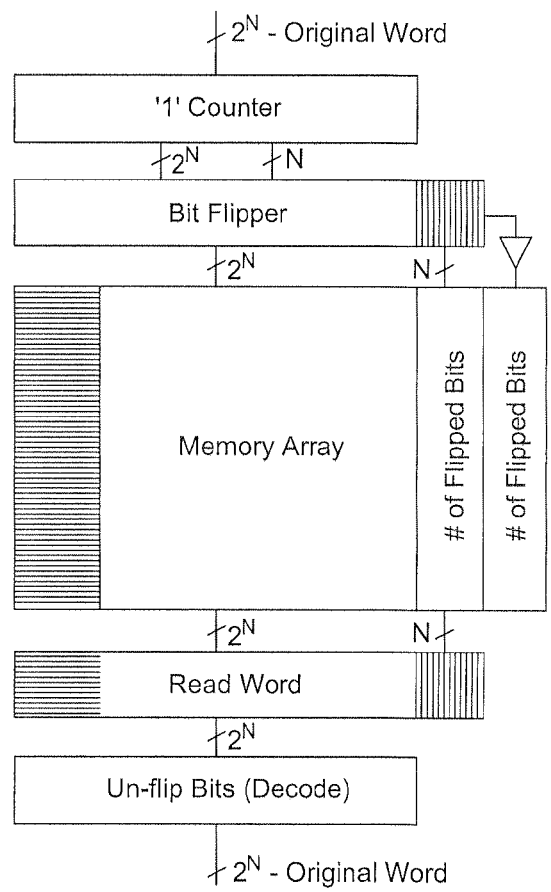
FIG. 6 is a block diagram of an example encoder/decoder.

FIG. 6 is an illustrative block diagram of an encoder/decoder in accordance with a preferred embodiment of the present invention. The first step in the encoder counts the number of '1's in the word. This count, along with the original word is fed into a 'bit flipper', which flips bits serially until the number of '1's is equal to the number of '0's, and counts the number of bits flipped. Next, the modified word will be written to memory, together with the counts of original '1's and number of bits flipped. On the decoder side, the word is first read from the memory, and bits are flipped to obtain the original word (performed in the Decode block). Also in this figure, the blocks with vertical fill lines are a binary representation of the number of bits that were flipped to achieve the balanced code. The horizontal fill line blocks represent the potential bits that were flipped.

For example, assume an input word to be stored of 10110111. The '1's counter will count six '1's and output that count as count1. Next, the bit flipper begins to flip the bits in the input word until the number of '1's equals the number of '0's. The first two bit "flips" from '1' to '0' and from '0' to '1' essentially cancel each other out. The third and fourth "flips" will flip '1's to '0's and consequently change the number of '1's from six to four, thereby equalizing the number of '1's and '0's in the word. At this point, the bit flipper stops flipping bits and outputs the number of bits flipped as count2 (here, four or 100 binary). The resultant modified word, 01000111, is then written to memory together with count2 and its inverse $\overline{\text{count2}}$. The reason for appending the inverse of count2 to the stored word is to maintain an equal number of '1' and '0' bits in the stored word.

Figure 7:
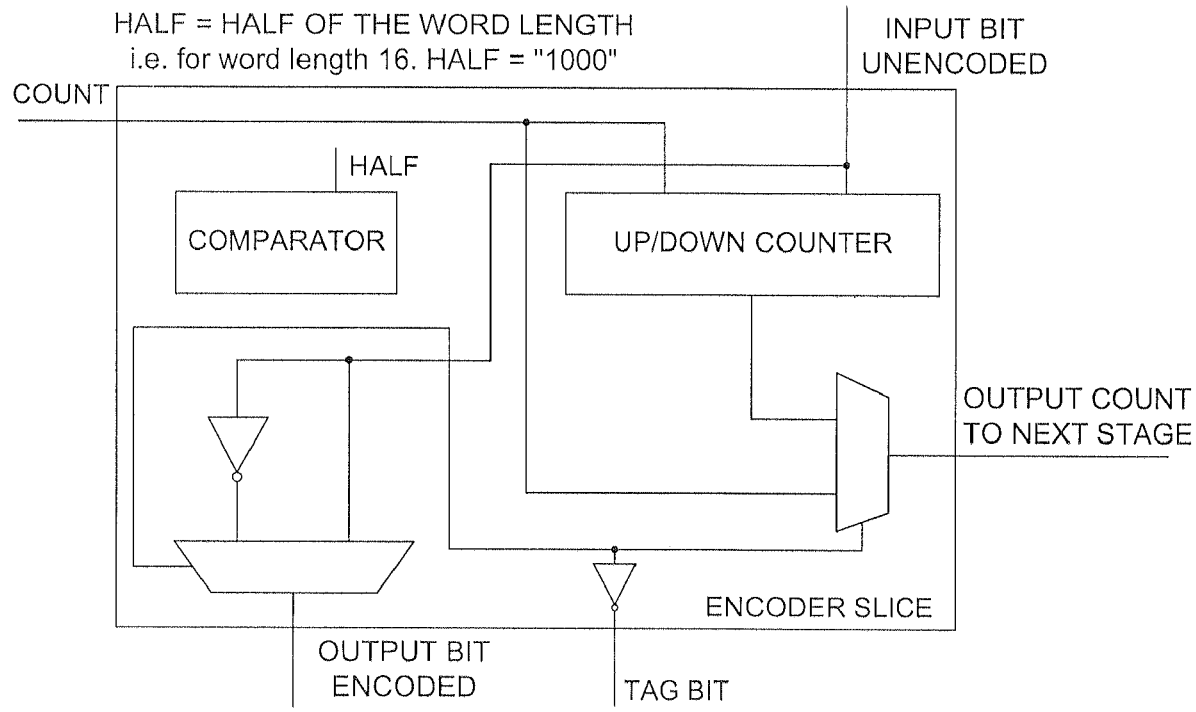
FIG. 7 is a block diagram of one slice of an encoder block in accordance with the invention.

FIG. 7 shows the detailed architecture of one embodiment of an encoder slice used in the 'Bit Flipper' in FIG. 6. Each slice takes in the input count, which is the current number of '1's in the word, and the unencoded input bit. The comparator compares the current input count to half of the length of the original input word. If this comparison is false, this means the word is unbalanced, and does not have half '1's and half '0's. If this comparison is true, then the word is balanced. Given a false comparison, the current input bit is flipped and fed to the output, and the up/down counter increases/decreases the '1' count based on which way the input bit was flipped. This count is then fed to the next stage. If the comparison returned as true, the original input bit is fed to the output without being flipped, and the input count (which happens to equal half of the length of the input word) is fed directly to the output without being updated.

Figure 8:
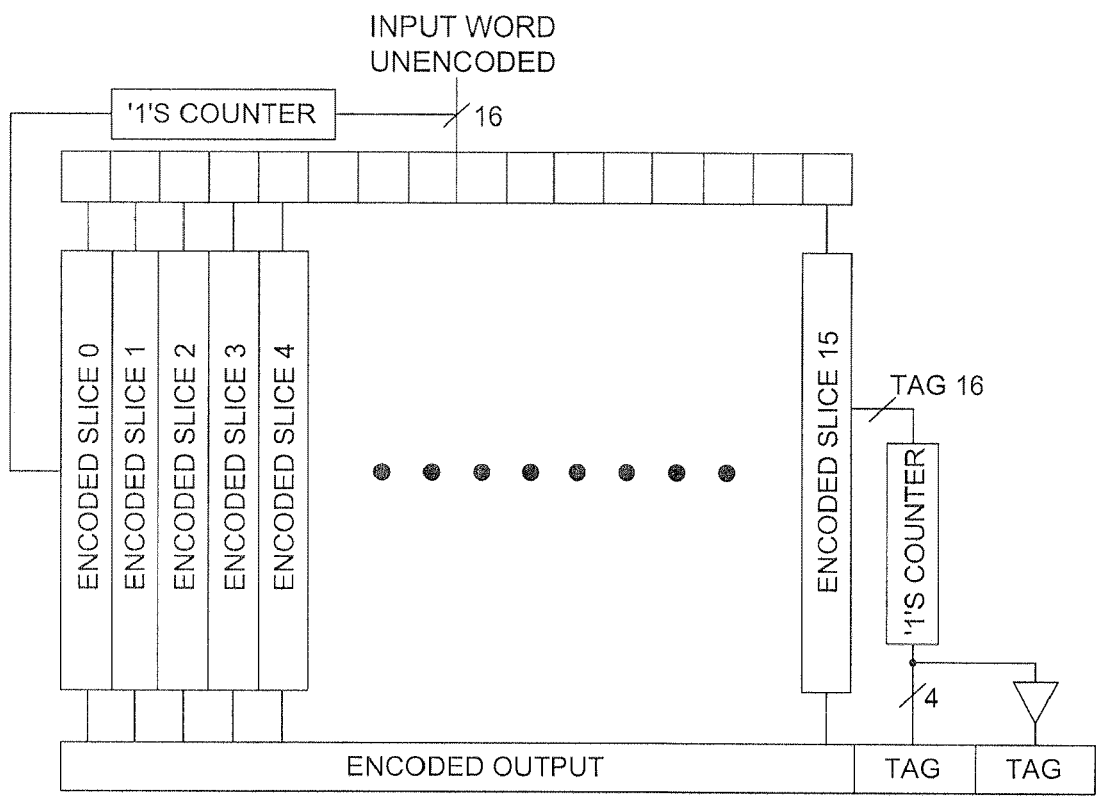
FIG. 8 is a block diagram of an overall hardware architecture of an encoder in accordance with the invention.

This slice is then included into a larger datapath, where there is one slice per bit in the word. This is shown in FIG. 8. This figure is an illustrative representation of the architecture of the encoder. First, the number of '1's in the input is determined by the '1' counter, and this count is fed into the first slice of the datapath. Then each slice determines whether the count has converged to half '1's and half '0's, and outputs the encoded word. These slices also output a tag, which is simply the number of bits that were flipped to achieve the encoded output. This tag, along with its inverse, is attached to the end of the encoded word. The reason the inverse of the tag is attached is to maintain the correct number of '1's and '0's, and makes it easy to determine whether there is a bit error in the tag. Simply XORing each bit in the tag with each bit in the inverse tag should yield a '1' if there is no bit error. If the result is '0', this means there is a bit error in the tag, and this row in memory must be replaced by some replacement method.

In the decoder, the bits of the modified word are simply flipped again, by count2. Going back to the example above, the modified word 01000111 is read from memory, together with count2 of 100 (i.e., four). Thus from count2 it is known that the first four bits of the modified word should be flipped. The resultant word, 10110111, consequently corresponds to the original word that was inputted to be stored in the memory.

Those of ordinary skill may vary the methods for writing and reading bits from memory, or the memory architecture without varying from the scope of the invention as defined in the appended claims.

What is claimed is:

1. An electronic data storage device comprising:
   a memory;
   an input device coupled to said memory for receiving an original multi-bit word having a first length;
   a counter that counts bits of a first value of said multi-bit word;
   a comparator that compares said counted bits of said first value with half of said first length and outputs a comparison value indicating whether there are an equal number of bits of each of two values in said multi-bit word;
   a bit-flipper that generates an encoded word by changing bit values of said multi-bit word so as to equalize the quantity of bits of each value in said multi-bit word, and writing said encoded word to said memory;
   wherein said encoded word includes information to decode said encoded word to said original multi-bit word when read from said memory.

2. The electronic data storage device of claim 1, further comprising an output device that changes data bit values of stored words read from said memory in conjunction with said information so as to decode read words to original multi-bit words.

3. The electronic data storage device of claim 2, wherein said bit flipper is capable of changing bits starting from one end of said multi-bit word until there are an equal number of bits of each value in said word.

4. The electronic data storage device of claim 3, wherein said bit flipper further comprises a first output to write said modified word with equal numbers of each bit value to said memory, and a second output to write a quantity of said changed data bits to said memory, as said information.

5. The electronic data storage device of claim 4, wherein said bit flipper further comprises a third output to write the inverse of said quantity of said changed bits to said memory, as part of said information.

6. The electronic data storage device of claim 4, wherein said output device comprises a bit un-flipper capable of changing bit values of words read from said memory back to their original state using said information.

7. The electronic data storage device of claim 1, wherein said memory is composed of wires arranged in a crossbar array.

8. The electronic data storage device of claim 7, wherein said wires are molecular nanowires.

9. A method of storing a multi-bit data word in an electronic memory, comprising:
   receiving an original multi-bit data word having a first length, wherein each bit of said multi-bit data word is one of a first value or a second value;
   counting the number of bits in said original multi-bit data word having said first value;
   comparing said counted number with half of said first length, and outputting a comparison value indicating whether there are an equal number of bits of each of said first and second values in said original multi-bit word;
   changing selected bit values in said original multi-bit word to form a modified word having equal numbers of bits of said first and second values;
   providing information to return said modified word to said original multi-bit word; and
   storing said modified word and said information in said memory.

10. The method of claim 9, wherein said selected bit values are '1's.

11. The method of claim 10, further comprising counting the number of '1's in said multi-bit word after changing a bit value thereof.

12. The method of claim 9, wherein selected bit values are sequentially changed starting from one end of said multi-bit data word until said multi-bit data word has an equal number of bits of each bit value.

13. The method of claim 12, further comprising writing to memory said multi-bit data word with equal numbers of bits of each bit value as said modified word, and the number of said changed data bits as said information.

14. The method of claim 13, further comprising writing to memory together with said number of changed bits, an inverse of said number of said changed data bits.

15. The method of claim 9, further comprising decoding said modified word read from memory by changing bit values of said modified word in accordance with said information.

16. The method of claim 9, wherein said memory is a crossbar memory array.

17. The method of claim 16, wherein said crossbar memory array is comprised of molecular nanowires.

18. An encoder stage for generating an encoded word from an original multi-bit word, comprising:
   a counter for counting the number of '1' bits in said original multi-bit word inputted to a data path of said encoder;
   a comparator for comparing the counted number of '1's with half of the length of said original multi-bit word;
   a circuit for outputting an inverted value of a selected bit of said original multi-bit word if a result of said comparison is false, and for outputting a non-inverted value of said selected bit if said comparison result is true; and
   an up/down counter that increments said count when an inverted value is a '1' bit and decrements said count when an inverted value is a '0' bit.

19. An electronic data storage device comprising a plurality of encoder stages as set forth in claim 18.

* * * * *